US012805354B2

(12) United States Patent
Choi

(10) Patent No.: US 12,805,354 B2
(45) Date of Patent: Nov. 17, 2026

(54) SEMICONDUCTOR PACKAGE AND METHOD OF MANUFACTURING THE SAME

(71) Applicant: JMJ Korea Co., Ltd., Busan (KR)

(72) Inventor: Yun Hwa Choi, Busan (KR)

(73) Assignee: JMJ Korea Co., Ltd., Busan (KR)

( * ) Notice: Subject to any disclaimer, the term of this patent is extended or adjusted under 35 U.S.C. 154(b) by 385 days.

(21) Appl. No.: 18/398,090

(22) Filed: Dec. 27, 2023

(65) Prior Publication Data

US 2024/0355723 A1 Oct. 24, 2024

(30) Foreign Application Priority Data

Apr. 19, 2023 (KR) ........................ 10-2023-0051350

(51) Int. Cl.

| | |
|---|---|
| ***H10W 70/65*** | (2026.01) |
| ***H10W 70/68*** | (2026.01) |
| ***H10W 70/69*** | (2026.01) |
| *H10W 72/00* | (2026.01) |
| *H10W 74/00* | (2026.01) |
| *H10W 90/00* | (2026.01) |

(52) U.S. Cl.

CPC ........... *H10W 70/65* (2026.01); *H10W 70/68* (2026.01); *H10W 70/69* (2026.01);

(Continued)

(58) Field of Classification Search

CPC ..... H10W 70/65; H10W 70/68; H10W 70/69; H10W 72/884; H10W 74/00;

(Continued)

(56) References Cited

U.S. PATENT DOCUMENTS 3,778,887 A * 12/1973 Suzuki ................ H10W 70/461 29/827
4,065,625 A * 12/1977 Iwai ...................... H10W 70/04 174/541

(Continued)

FOREIGN PATENT DOCUMENTS

JP 2021-72425 A 5/2021
KR 10-2001-0111736 A 12/2001

(Continued)

*Primary Examiner* — Tucker J Wright

(74) *Attorney, Agent, or Firm* — Park, Kim & Suh, LLC

(57) ABSTRACT

The present invention provides a semiconductor package including a lead frame pad 110 including at least one first substrate 111 and at least one second substrate 112 structurally bonded to one surface of the first substrate 111, at least one semiconductor chip 120 bonded onto the second substrate 112 by using a conductive adhesive, a lead frame lead 130 including at least one first terminal 131 structurally or electrically connected to the lead frame pad 110 and at least one second terminal 132 spaced apart from the lead frame pad 110 by a regular distance, an electrical connection member 140 electrically connecting the semiconductor chip 120 with the second terminal 132, and a housing 150 partially or entirely covering the semiconductor chip 120 and the lead frame pad 110. Here, the lead frame lead 130 is exposed and extended to the outside of the housing 150 and the thickness of the second substrate 112 is less than the thickness of the first substrate 111. Accordingly, the semiconductor chip 120 may be easily installed and excellent electrical conductivity may be realized.

18 Claims, 16 Drawing Sheets

(52) U.S. Cl.
CPC .......... *H10W 72/884* (2026.01); *H10W 74/00* (2026.01); *H10W 90/734* (2026.01); *H10W 90/755* (2026.01)

(58) Field of Classification Search
CPC . H10W 90/734; H10W 90/755; H10W 72/30; H10W 72/50; H10W 70/461; H10W 70/465; H10W 72/071; H10W 70/421
See application file for complete search history.

(56) References Cited

U.S. PATENT DOCUMENTS

| | | | | |
|---|---|---|---|---|
| 2006/0071335 | A1* | 4/2006 | Kotaki | H10W 70/457<br>257/734 |
| 2011/0291236 | A1* | 12/2011 | Hayashi | H10W 90/811<br>257/532 |
| 2012/0248592 | A1* | 10/2012 | Hata | H10W 70/481<br>257/676 |
| 2016/0056092 | A1* | 2/2016 | Otremba | B23K 1/19<br>257/676 |
| 2018/0197810 | A1* | 7/2018 | Fukuzaki | H10W 70/457 |

FOREIGN PATENT DOCUMENTS

| | | | |
|---|---|---|---|
| KR | 10-0685253 | B1 | 2/2007 |
| KR | 10-0795609 | B1 | 1/2008 |
| KR | 10-2009-0025593 | A | 3/2009 |
| KR | 10-1682067 | B1 | 12/2016 |
| KR | 10-2172689 | B1 | 11/2020 |
| KR | 10-2020-0145091 | A | 12/2020 |
| KR | 10-2228945 | B1 | 3/2021 |

* cited by examiner

SEMICONDUCTOR PACKAGE AND METHOD OF MANUFACTURING THE SAME

CROSS-REFERENCE TO RELATED PATENT APPLICATION

This application claims the benefit of Korean Patent Application No. 10-2023-0051350, filed on Apr. 19, 2023, in the Korean Intellectual Property Office, the disclosure of which is incorporated herein in its entirety by reference.

BACKGROUND OF THE INVENTION

1. Field of the Invention

The present invention relates to a semiconductor package and a method of manufacturing the same, and more particularly, to a semiconductor package and a method of manufacturing the same in which substrates are bonded in a multi-layered vertical structure so that a semiconductor chip may be easily installed and excellent electrical conductivity may be realized.

2. Description of the Related Art

Generally, in a packaged power semiconductor device, a substrate, on which a semiconductor chip is bonded, and a lead frame lead, which is electrically connected to the semiconductor chip or the substrate, supply an electrical signal by using copper.

In this regard, for example, Korean Patent Registration No. 10-0685253 (packaged power semiconductor device, published on Feb. 22, 2007) is disclosed. As illustrated in FIG. 1, a general packaged power semiconductor device includes a power semiconductor die 26 soldered to a direct bonded copper (DBC) substrate 28 and a sealing layer 36, wherein the DBC substrate 28 includes a first copper layer 30 and a ceramic layer 32 at the die side and a second copper layer 34 at the rear side and the sealing layer 36 is formed on the upper part of the power semiconductor die 26, the DBC substrate 28, and a device conducting wire 38 soldered to the first copper layer 30 through a solder 40.

As described above, in order to improve thermal efficiency of a semiconductor, a thick copper material is generally used to bond a semiconductor chip and heat is radiated. However, due to the price of a copper material and weight according to its thickness, the weight of a semiconductor package itself increases so that battery consumption and a production cost may increase when the semiconductor package is applied to an electric vehicle. In this regard, when an aluminum material is used as a substrate to which a semiconductor chip is bonded, in order to reduce a production cost, the semiconductor chip may be hardly bonded to the substrate due to an aluminum oxide film.

In this regard, there is a demand for the technology that may separately form a substrate so that a semiconductor chip may be easily bonded to the substrate, the weight of a semiconductor package may be reduced, and a production cost may be lowered.

SUMMARY OF THE INVENTION

The present invention provides a semiconductor package and a method of manufacturing the same in which substrates are bonded in a multi-layered vertical structure so that a semiconductor chip may be easily installed and excellent electrical conductivity and heat radiation performance may be realized.

According to an aspect of the present invention, there is provided a semiconductor package including: a lead frame pad comprising at least one first substrate and at least one second substrate structurally bonded to one surface of the first substrate; at least one semiconductor chip bonded onto the second substrate by using a conductive adhesive; a lead frame lead comprising at least one first terminal structurally or electrically connected to the lead frame pad and at least one second terminal spaced apart from the lead frame pad by a regular distance; an electrical connection member electrically connecting the semiconductor chip with the second terminal; and a housing partially or entirely covering the semiconductor chip and the lead frame pad, wherein the lead frame lead is exposed and extended to the outside of the housing and the thickness of the second substrate is less than the thickness of the first substrate.

Here, the second substrate may be inserted into and bonded to the first substrate.

Also, the second substrate may be bonded to the upper surface or the lower surface of the first substrate.

Also, the first substrate and the second substrate may be formed of each different metal material.

Also, the first substrate and the second substrate may be formed of the same metal material.

Also, a horizontal area of the second substrate may be smaller than a horizontal area of the first substrate.

Also, a horizontal area of the second substrate may be same as a horizontal area of the first substrate.

Also, the first substrate may contain 50% or more of Al components compared to the total weight.

Also, the second substrate may contain 50% or more of Cu components compared to the total weight.

Also, a difference of a height-level between the surface of the first substrate and the surface of the second substrate may be below 0.1 mm.

Also, the first terminal may be structurally connected to the first substrate or the second substrate.

Also, the bonded surface of the first terminal structurally bonded to the surface of the lead frame pad may be formed of a metal material containing 50% or more of Cu or Al components compared with the total weight.

Also, the first terminal may have a stacked structure formed of at least two different metals.

Also, the first terminal may be separated into a terminal A and a terminal B, wherein the terminal B is inserted into and bonded to the terminal A.

Here, the thickness of the terminal B may be less than the thickness of the terminal A.

Also, the first terminal may be separated into a terminal A, a terminal B, and a terminal C which are combined to have a stacked structure.

Here, the thickness of the terminal B or the terminal C may be less than the thickness of the terminal A.

Also, the surface of the at least one first terminal or the at least one second terminal included in the lead frame lead and exposed to the outside of the housing may be plated with 50% or more of Sn components compared with the total weight to cover 80% or more of the exposed surface.

Also, the surface of the at least one first terminal or the at least one second terminal included in the lead frame lead and exposed to the outside of the housing may be plated with 50% or more of Sn components compared with the total weight to entirely cover the exposed surface.

Here, the surface of the first terminal or the second terminal may be plated by being immersed in a solder including Sn components for a certain period of time and pulled out.

Also, the second substrate is connected to the first terminal as one body formed of the same metal material.

Also, the lead frame pad and the first terminal may be structurally connected to each other by ultrasonic welding or by using a conductive bonding material.

Also, the lead frame pad may include a penetration hole to connect with a heat sink.

According to another aspect of the present invention, there is provided a semiconductor package including: lead frame pad comprising at least one first substrate, at least one second substrate structurally bonded to one surface of the first substrate, and at least one third substrate structurally bonded to the other surface of the first substrate; at least one semiconductor chip bonded onto the second substrate by using a conductive adhesive; a lead frame lead comprising at least one first terminal structurally or electrically connected to the lead frame pad and at least one second terminal spaced apart from the lead frame pad by a regular distance; an electrical connection member electrically connecting the semiconductor chip with the second terminal; and a housing partially or entirely covering the semiconductor chip and the lead frame pad, wherein the lead frame lead is exposed and extended to the outside of the housing and the thickness of the second substrate or the third substrate is less than the thickness of the first substrate.

Here, the second substrate or the third substrate may be inserted into and bonded to the first substrate.

Also, the second substrate may be bonded to the upper surface of the first substrate and the third substrate may be bonded to the lower surface of the first substrate, or the second substrate may be bonded to the lower surface of the first substrate and the third substrate may be bonded to the upper surface of the first substrate.

Also, the first substrate and the second substrate or the third substrate may be formed of each different metal material.

Also, the first substrate and the second substrate or the third substrate may be formed of the same metal material.

Also, a horizontal area of the second substrate or the third substrate may be smaller than a horizontal area of the first substrate.

Also, a horizontal area of the second substrate or the third substrate may be same as a horizontal area of the first substrate.

Also, the second substrate or the third substrate may contain 50% or more of Cu components compared to the total weight.

According to another aspect of the present invention, there is provided a method of manufacturing a semiconductor package including: preparing a lead frame pad including at least one first substrate and at least one second substrate structurally bonded to one surface of the first substrate; installing at least one semiconductor chip onto the second substrate by using a conductive adhesive; forming a lead frame lead in such a way that at least one first terminal is structurally or electrically connected to the lead frame pad and at least one second terminal is formed to be spaced apart from the lead frame pad by a regular distance; electrically connecting the semiconductor chip to the second terminal by using an electrical connection member; and forming a housing to partially or entirely cover the semiconductor chip and the lead frame pad, wherein the lead frame lead is exposed and extended to the outside of the housing and the thickness of the second substrate is less than the thickness of the first substrate.

In addition, according to another aspect of the present invention, there is provided a method of manufacturing a semiconductor package including: preparing a lead frame pad including at least one first substrate, at least one second substrate structurally bonded to one surface of the first substrate, and at least one third substrate structurally bonded to the other surface of the first substrate; installing at least one semiconductor chip onto the second substrate by using a conductive adhesive; forming a lead frame lead in such a way that at least one first terminal is structurally or electrically connected to the lead frame pad and at least one second terminal is formed to be spaced apart from the lead frame pad by a regular distance; electrically connecting the semiconductor chip to the second terminal by using an electrical connection member; and forming a housing to partially or entirely cover the semiconductor chip and the lead frame pad, wherein the lead frame lead is exposed and extended to the outside of the housing and the thickness of the second substrate or the third substrate is less than the thickness of the first substrate.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
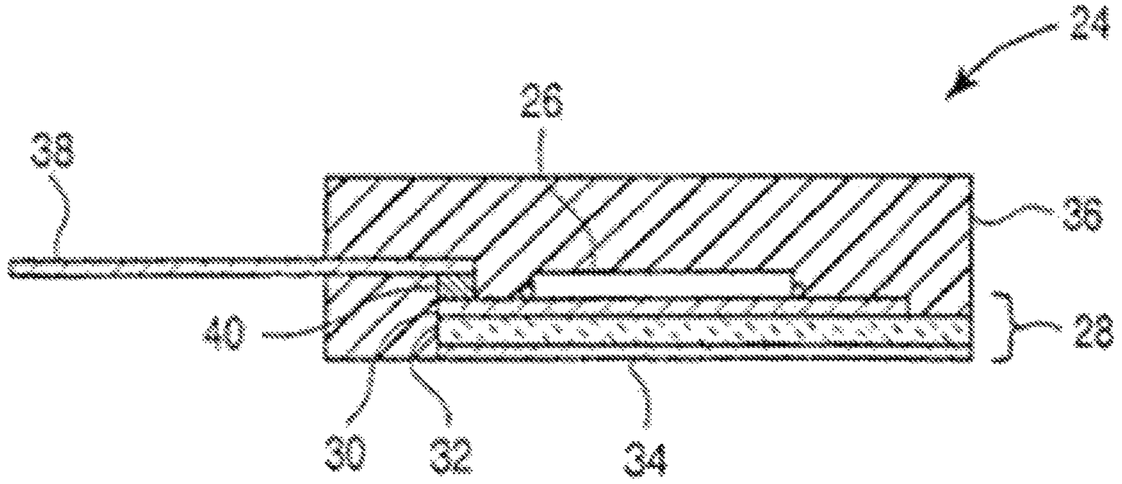
FIG. 1 illustrates a semiconductor package according to a conventional art.

Hereinafter, embodiments of the present invention will be described in more detail with reference to the accompanying drawings.

A semiconductor package according to an embodiment of the present invention includes a lead frame pad 110 including at least one first substrate 111 and at least one second substrate 112 structurally bonded to one surface of the first substrate 111, at least one semiconductor chip 120 bonded onto the second substrate 112 by using a conductive adhesive, a lead frame lead 130 including at least one first terminal 131 structurally or electrically connected to the lead frame pad 110 and at least one second terminal 132 spaced apart from the lead frame pad 110 by a regular distance, an electrical connection member 140 electrically connecting the semiconductor chip 120 with the second terminal 132, and a housing 150 partially or entirely covering the semiconductor chip 120 and the lead frame pad 110. Here, the lead frame lead 130 is exposed and extended to the outside of the housing 150 and the thickness of the second substrate 112 is less than the thickness of the first substrate 111. Accordingly, the semiconductor chip 120 may be easily installed and excellent electrical conductivity may be realized.

A semiconductor package according to another embodiment of the present invention includes the lead frame pad 110 including at least one first substrate 111, at least one second substrate 112 structurally bonded to one surface of the first substrate 111, and at least one third substrate 113 structurally bonded to the other surface of the first substrate 111, at least one semiconductor chip 120 bonded to the second substrate 112 by using a conductive adhesive, the lead frame lead 130 including at least one first terminal 131 structurally or electrically connected to the lead frame pad 110 and at least one second terminal 132 spaced apart from the lead frame pad 110 by a regular distance, the electrical connection member 140 electrically connecting the semiconductor chip 120 with the second terminal 132, and the housing 150 partially or entirely covering the semiconductor chip 120 and the lead frame pad 110. Here, the lead frame lead 130 is exposed and extended to the outside of the housing 150 and the thickness of the second substrate 112 or the third substrate 113 is less than the thickness of the first substrate 111. Accordingly, the semiconductor chip 120 may be easily installed and excellent electrical conductivity and heat radiation performance may be realized.

Hereinafter, the semiconductor package described above will be described in more detail with reference to FIGS. 2A, 2B through 11A, 11B.

First, the lead frame pad 110 includes at least one first substrate 111, at least one second substrate 112 structurally bonded to one surface of the first substrate 111, and/or at least one third substrate 113 structurally bonded to the other surface of the first substrate 111.

For example, the lead frame pad 110 includes at least one first substrate 111, at least one second substrate 112 structurally bonded to an upper surface or a lower surface of the first substrate 111, and/or at least one third substrate 113 structurally bonded to a lower surface or an upper surface of the first substrate 111.

As described above, the first substrate 111, which is a base substrate, the second substrate 112 on which the semiconductor chip 120 is installed, and/or the third substrate 113 may be each separately formed using a different metal. For example, the first substrate 111 may be formed of a metal which is at a relatively low price and light-weighted, and the second substrate 112 and/or the third substrate 113 may be formed of a metal which is at a relatively high price and heavy. Accordingly, excellent electrical conductivity and heat radiation performance may be maintained, the weight may be reduced, and a production cost may be lowered.

That is, the first substrate 111 may be formed of an Al material, and the second substrate 112 and/or the third substrate 113 may be formed of Cu or an Cu alloy which facilitates installation of the semiconductor chip 120 and has excellent heat radiation performance or may be formed of at least any one of Ni, Ag, Pd, and Au so as to realize excellent electrical conductivity and heat radiation performance. The thickness of the second substrate 112 and/or the third substrate 113 may be less than the thickness of the first substrate 111 so that the total weight may be reduced and a production cost may be lowered.

Preferably, the first substrate 111 may contain 50% or more of Al components compared to the total weight of the corresponding substrate and the second substrate 112 and/or the third substrate 113 may contain 50% or more of Cu components compared to the total weight of the corresponding substrate.

As described above, the first substrate 111, the second substrate 112, and/or the third substrate 113 may be formed of each different metal material, however, the first substrate 111, the second substrate 112, and the third substrate 113 may be formed of the same metal material.

Also, a horizontal area of the second substrate 112, on which the semiconductor chip 120 is installed, and/or the third substrate 113 exposed to the outside of the housing 150 may be formed to be smaller than a horizontal area of the first substrate 111 or a horizontal area of the second substrate 112 and/or the third substrate 113 may be the same as a horizontal area of the first substrate 111.

Figure 2A:
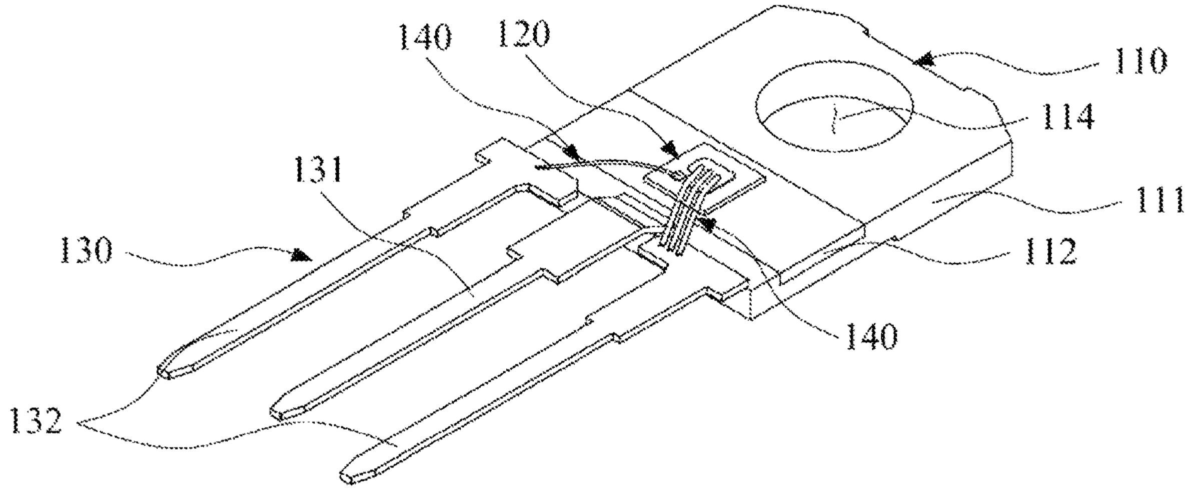
FIGS. 2A, 2B and 3A, 3B respectively illustrate a first example of a semiconductor package according to an embodiment of the present invention.
Figure 2B:
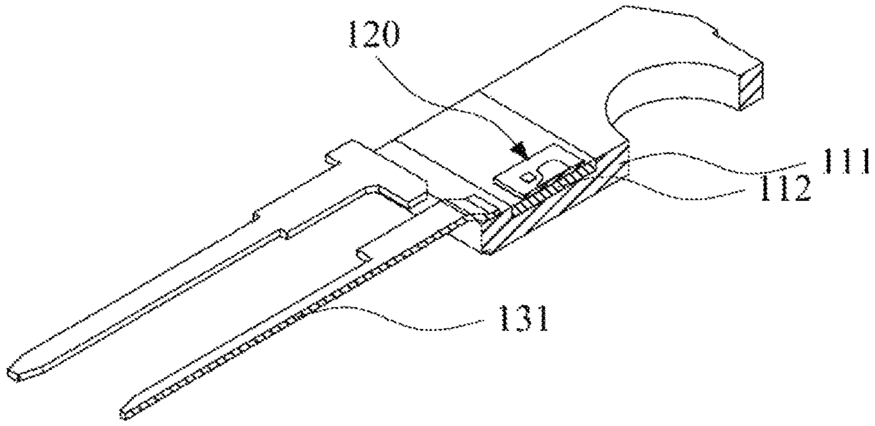
Figure 3A:
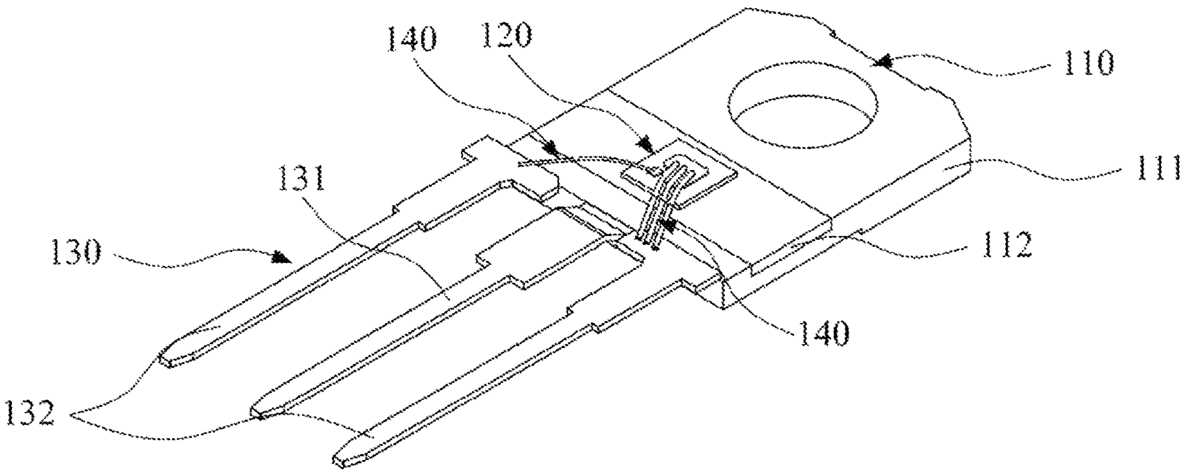
Figure 3B:
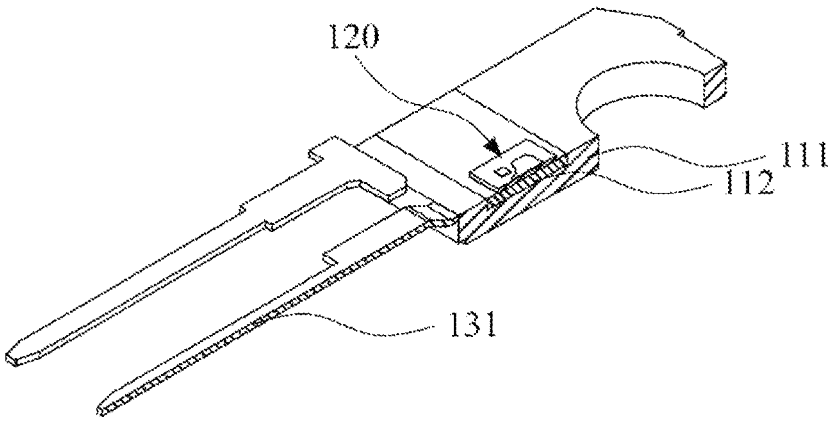
Figure 4A:
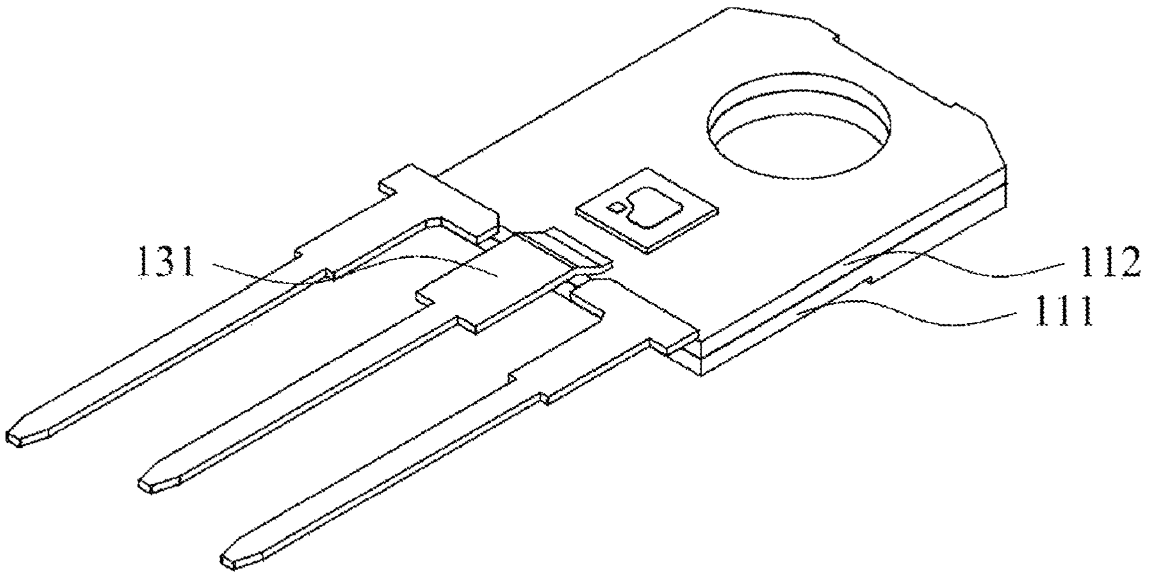
FIGS. 4A, 4B illustrate a second example of a semiconductor package according to an embodiment of the present invention.
Figure 4B:
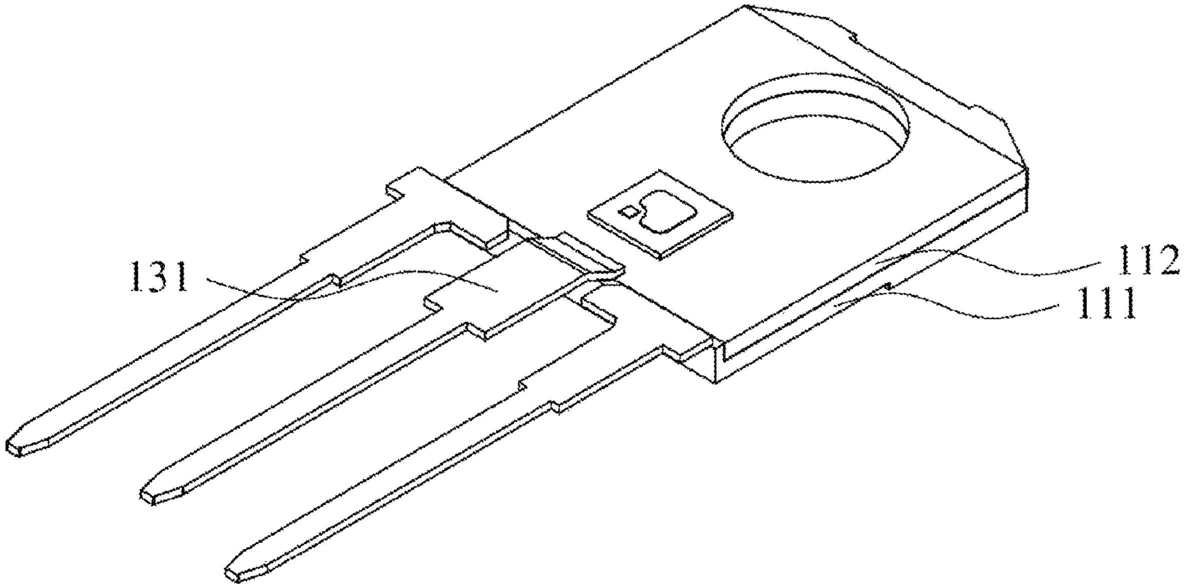
Figure 5A:
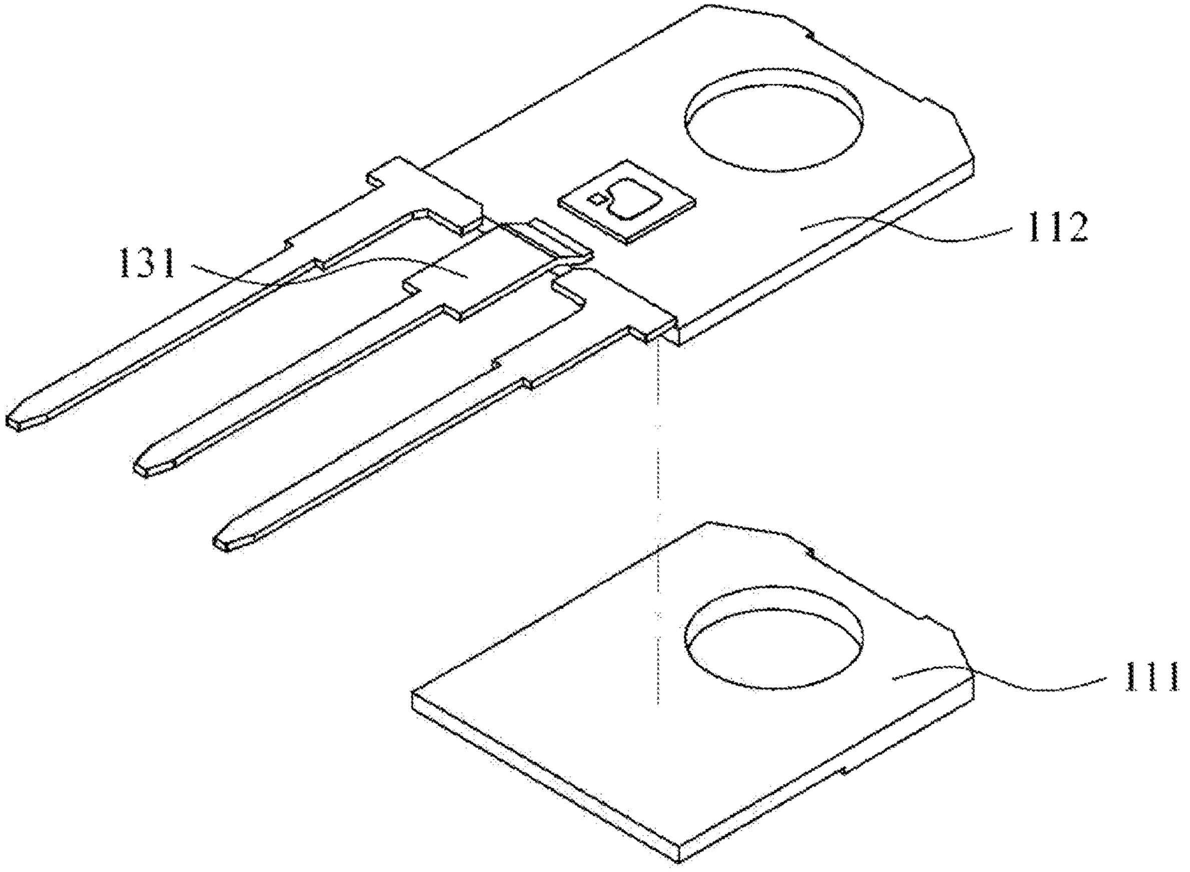
FIGS. 5A, 5B are an exploded view of the semiconductor package of FIGS. 4A, 4B.
Figure 5B:
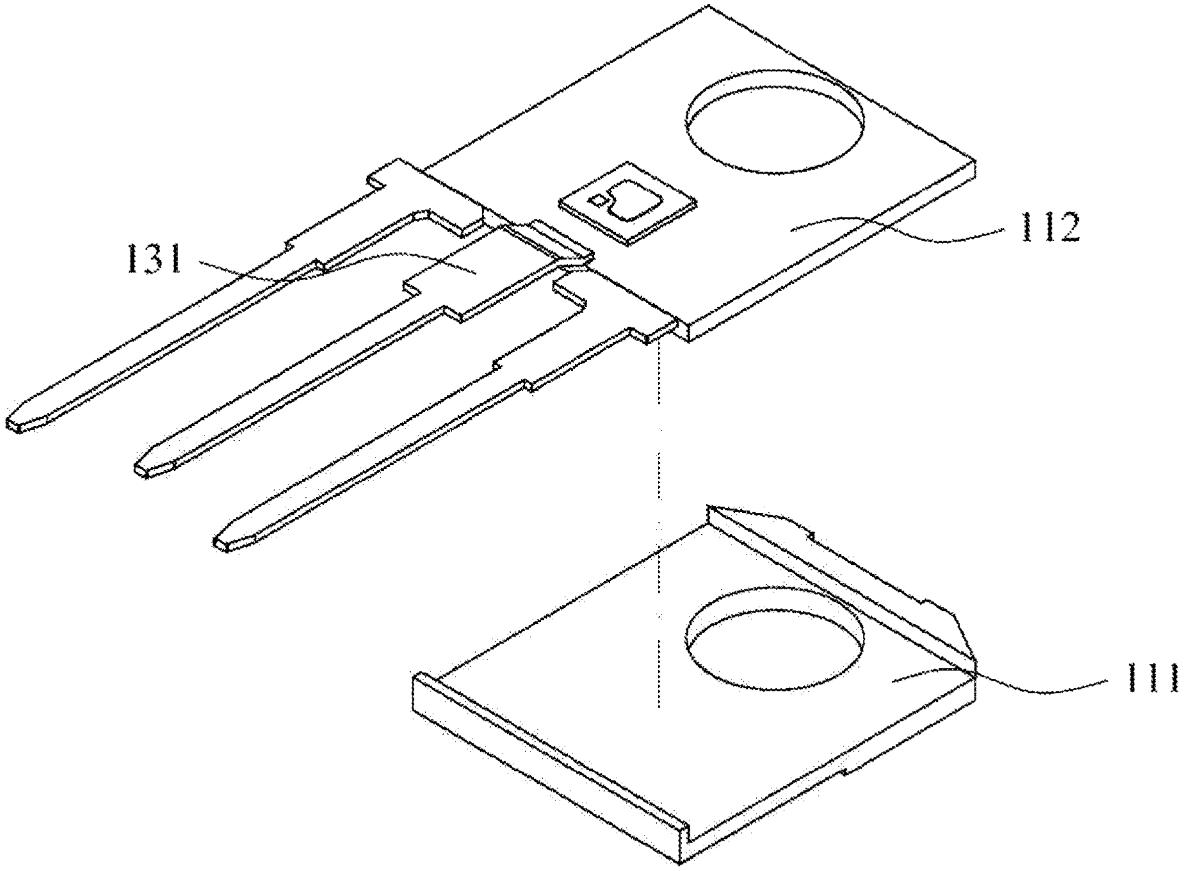
Figure 6A:
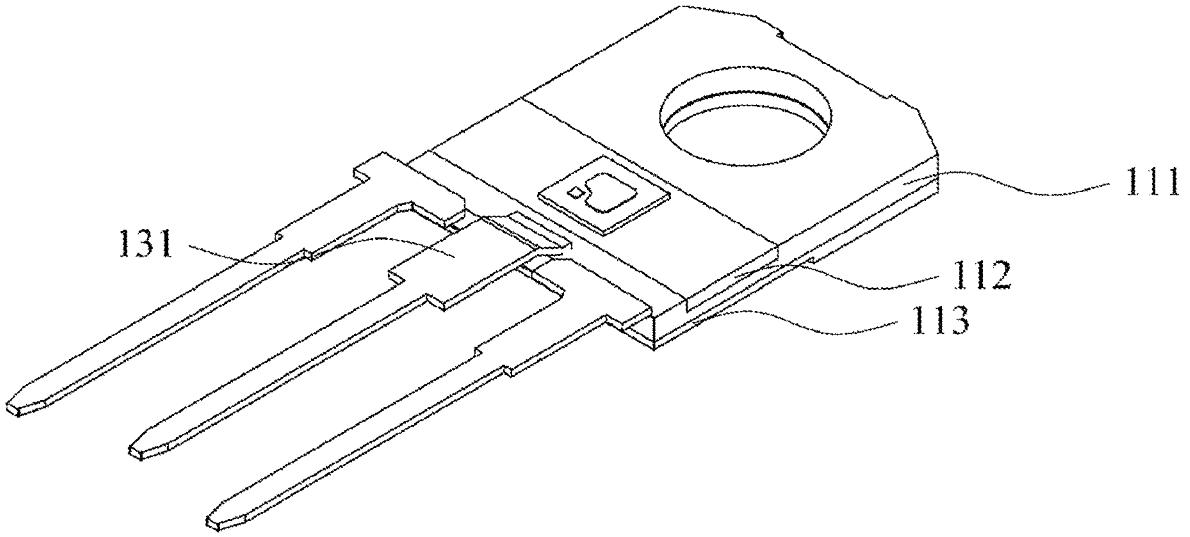
FIGS. 6A, 6B illustrate a third example of a semiconductor package according to an embodiment of the present invention.
Figure 6B:
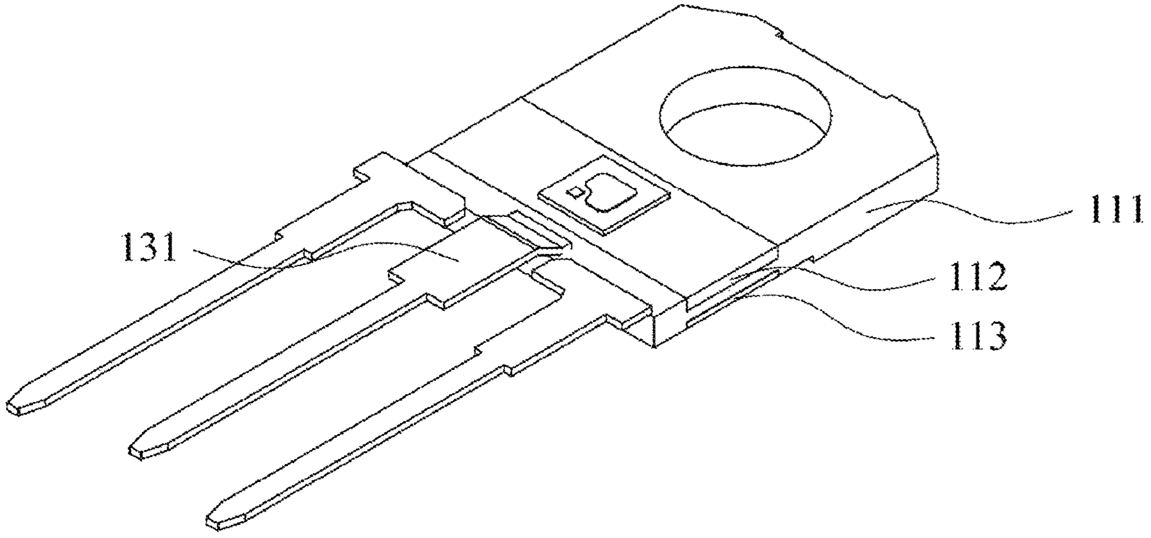
Figure 7A:
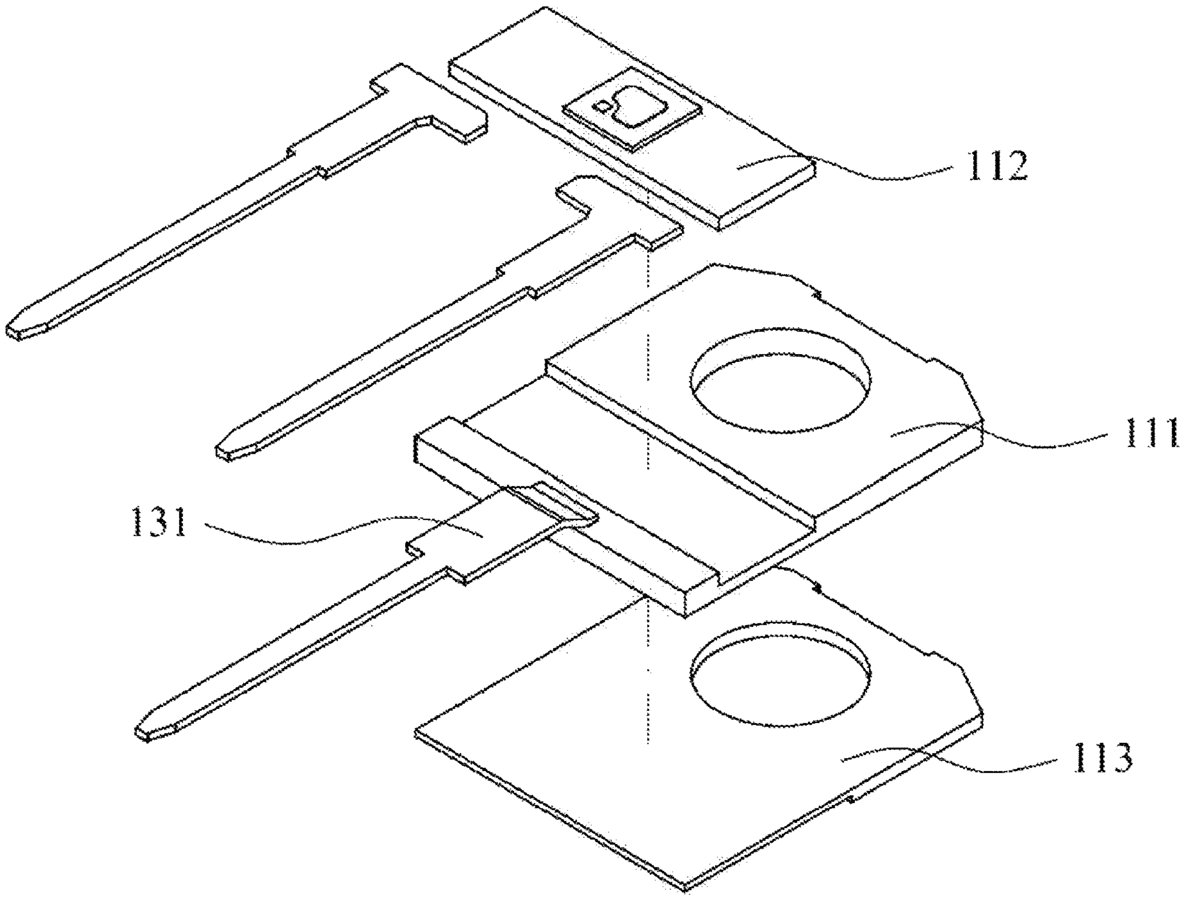
FIGS. 7A, 7B are an exploded view of the semiconductor package of FIGS. 6A, 6B.
Figure 7B:
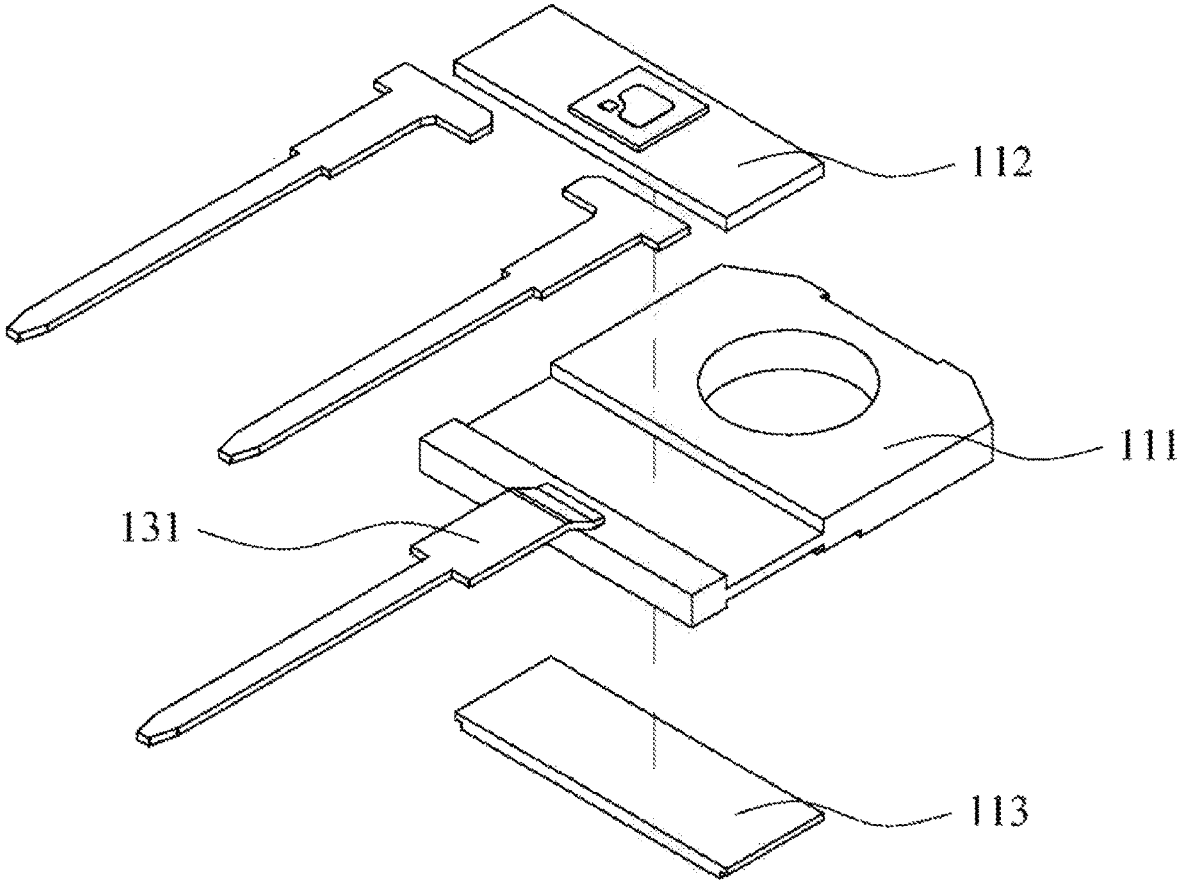

In addition, as illustrated in FIGS. 2B and 3B, a difference of a height-level between the top surface of the first substrate 111 and the top surface of the second substrate 112 may be below 0.1 mm.

For example, the top surface of the first substrate 111 may be protruded compared to the top surface of the second substrate 112 by 0.1 mm or below. More specifically, referring to FIGS. 2B and 3B, the second substrate 112 may be inserted into and bonded to the first substrate 111 with a vertical structure. Here, the top surface of the first substrate 111 is formed to be protruded compared to the top surface of the second substrate 112 and a conductive adhesive (not illustrated) is included on the second substrate 112. Accordingly, at least a part of the conductive adhesive may be surrounded by the protruded first substrate 111 and may be prevented from flowing to the outside while the semiconductor chip 120 is bonded to the second substrate 112.

On the other hand, the top surface of the second substrate 112 may be protruded compared to the top surface of the first substrate 111 by 0.1 mm or below. In this regard, when the lead frame lead 130 is electrically connected to the semiconductor chip 120 installed on the second substrate 112 through the electrical connection member 140, an electrical connection distance may be formed to be short and thereby, electrical resistance may be reduced.

Next, one or more semiconductor chips 120 are included and thereby, are bonded onto the second substrate 112 by using a conductive adhesive (not illustrated).

Here, the conductive adhesive may be a solder series containing at least any one of Sn, Pb, and Bi applied to soldering or may be a sinter material containing at least any one of Ag and Cu applied to sintering.

Also, a silicon control rectifier (SCR), a power transistor, an insulated gate bipolar transistor (IGBT), a metal oxide semiconductor field effect transistor (MOSFET), a power rectifier, a power regulator, or a power semiconductor including a combination thereof may be applied as the semiconductor chip 120.

Next, the lead frame lead 130 includes at least one first terminal 131 structurally or electrically connected to the lead frame pad 110 and at least one second terminal 132 spaced apart from the lead frame pad 110 by a regular distance. Accordingly, an electrical signal may be applied to the outside of the housing 150 from the semiconductor chip 120 and the first terminal 131 may support the first substrate 111.

Figure 11A:
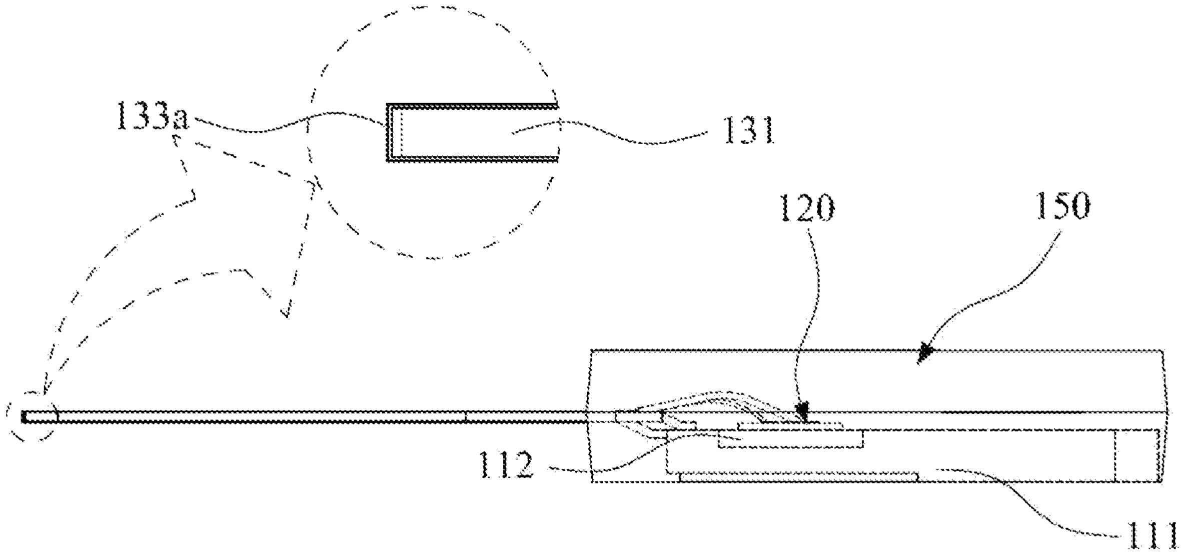
FIGS. 11A, 11B illustrate a sixth example of a semiconductor package according to an embodiment of the present invention.

Also, as illustrated in FIG. 11A, the surface of the at least one first terminal 131 and/or the at least one second terminal 132 included in the lead frame lead 130 and exposed to the outside of the housing 150 may include a plating layer 133*a* plated with 50% or more of Sn components compared with the total weight of the corresponding terminal to entirely cover the exposed surface.

Figure 11B:
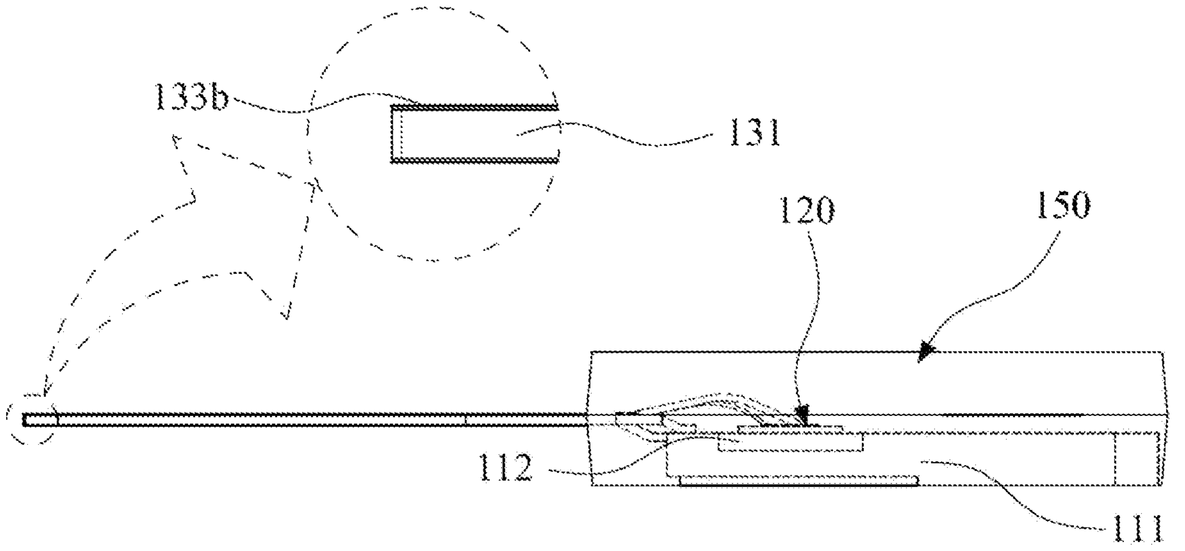

In addition, as illustrated in FIG. 11B, the surface of the at least one first terminal 131 and/or the at least one second terminal 132 included in the lead frame lead 130 and exposed to the outside of the housing 150 may include a plating layer 133*b* plated with 50% or more of Sn components compared with the total weight of the corresponding terminal to cover approximately 80% or more of the exposed surface. That is, a longitudinal section of the corresponding terminal is not plated and is exposed.

Here, the plating layers 133*a* and 133B may be formed by being plated in such a way that the surface of the first terminal 131 or the second terminal 132 is immersed in a solder including Sn components for a certain period of time and is pulled out.

Also, as illustrated in FIGS. 2A, 2B, 3A, 3B, 6A, 6B, and 10A, 10B the first terminal 131 may be structurally connected to the first substrate 111 or as illustrated in FIGS. 4A, 4B and 8A, 8B, the first terminal 131 may be structurally connected to the second substrate 112.

In addition, the bonded surface of the first terminal 131 structurally bonded to the surface of the lead frame pad 110 may be formed of a metal material containing more than 50% of at least any one of Cu and Al components compared with the total weight of the corresponding terminal and thereby, electrical conductivity may be increased.

Next, referring to FIGS. 2A, 2B and 3A, 3B, the electrical connection member 140 is formed as a wire or a metal clip so as to electrically connect the semiconductor chip 120 to the second terminal 132.

Next, the housing 150 is an insulator for protecting a circuit. Referring to FIGS. 11A, 11B, the housing 150 is formed to partially or entirely cover the semiconductor chip 120 and the lead frame pad 110 and the lead frame lead 130 is exposed to the outside of the housing 150 so that internal composition may be protected.

For example, the housing 150 may be formed through molding using an Epoxy Molding Compound (EMC) or injection molding using a mold formed of PolyButylene Terephtalate (PBT), PolyPhenylene Sulfide (PPS), and the like.

Also, the first substrate 111 and/or the third substrate 113 may be partially or entirely exposed to the outside of the housing 150 and thereby, may contact a heat sink (not illustrated). The lead frame pad 110 may include a penetration hole 114 (refer to FIG. 2A) to connect with the heat sink.

Meanwhile, various bonding structures within elements forming the semiconductor package described above are as follows.

That is, the second substrate 112 may be inserted into and bonded to the first substrate 111 in a vertical structure.

Referring to FIGS. 2A, 2B and 3A, 3B, as an example of a first vertical structure, the second substrate 112 may be inserted into and bonded to the first substrate 111 in a vertical structure. As in FIGS. 2A, 2B, the first terminal 131 may be structurally bonded to one side of the upper surface of the first substrate 111 or as in FIGS. 3A, 3B, the first terminal 131 may be structurally bonded to one side of the front surface of the first substrate 111.

Here, the lead frame pad 110 and the first terminal 131 may be structurally connected to each other by ultrasonic welding or by using a conductive bonding material.

For example, the first substrate 111 and the first terminal 131 may be connected to each other by ultrasonic welding, by using an adhesive such as a solder, a sinter material, or an epoxy based bonding material, or by using a technology for manufacturing a clad material.

Referring to FIGS. 4A, 4B and 5A, 5B, as an example of a second vertical structure, the second substrate 112 may be bonded to the upper surface or the lower surface of the first substrate 111 in a vertical structure. As in FIGS. 4A and 5A, the second substrate 112 is bonded to the upper surface of the first substrate 111 having the same surface area and the first terminal 131 is structurally connected to the upper surface of the second substrate 112 or as in FIGS. 4B and 5B, the first terminal 131 is structurally connected to one side of the upper surface of the second substrate 112 and the second substrate 112 is inserted into and bonded to the upper surface of the first substrate 111.

Referring to FIGS. 6A, 6B and 7A, 7B, as an example of a third vertical structure, the second substrate 112 and/or the third substrate 113 may be bonded to the upper surface or the lower surface of the first substrate 111 in a vertical structure. As in FIGS. 6A and 7A, the second substrate 112 is inserted into the first substrate 111, the third substrate 113 is additionally bonded to the lower surface of the first substrate 111, and the first terminal 131 is structurally connected to one side of the upper surface of the first substrate 111 or as in FIGS. 6B and 7B, the second substrate 112 is inserted into the first substrate 111, the third substrate 113 is additionally inserted into and bonded to the lower surface of the first substrate 111, and the first terminal 131 is structurally connected to one side of the upper surface of the first substrate 111.

Figure 8A:
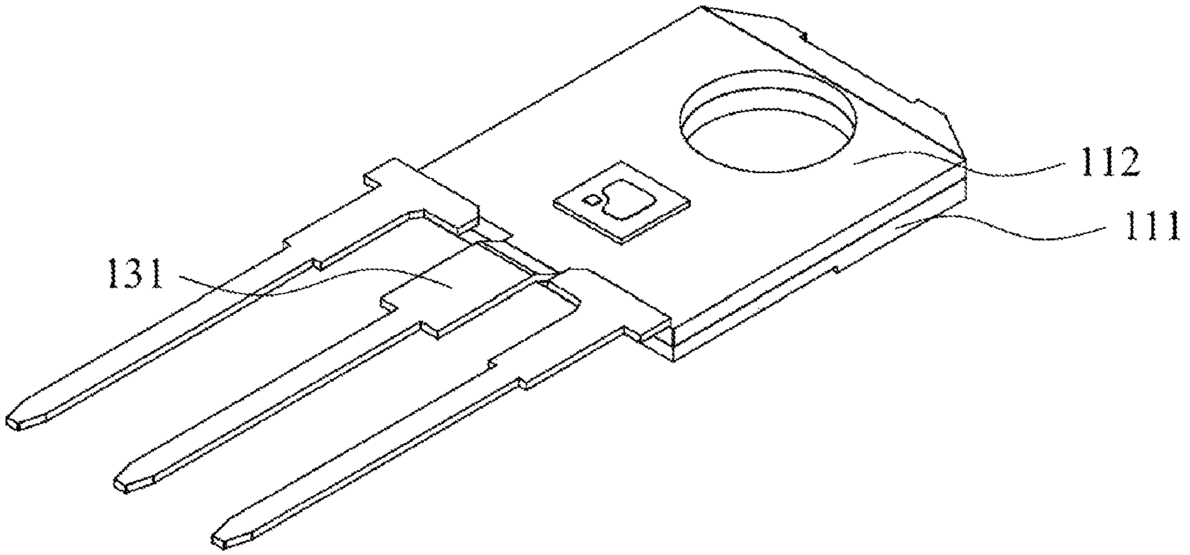
FIGS. 8A, 8B illustrate a fourth example of a semiconductor package according to an embodiment of the present invention.
Figure 8B:
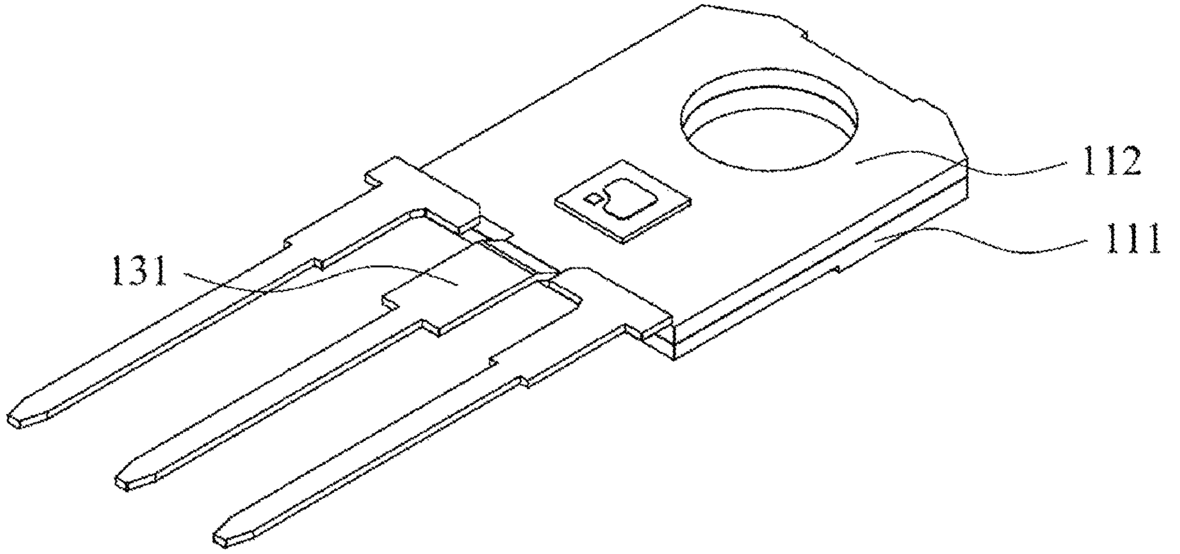
Figure 9A:
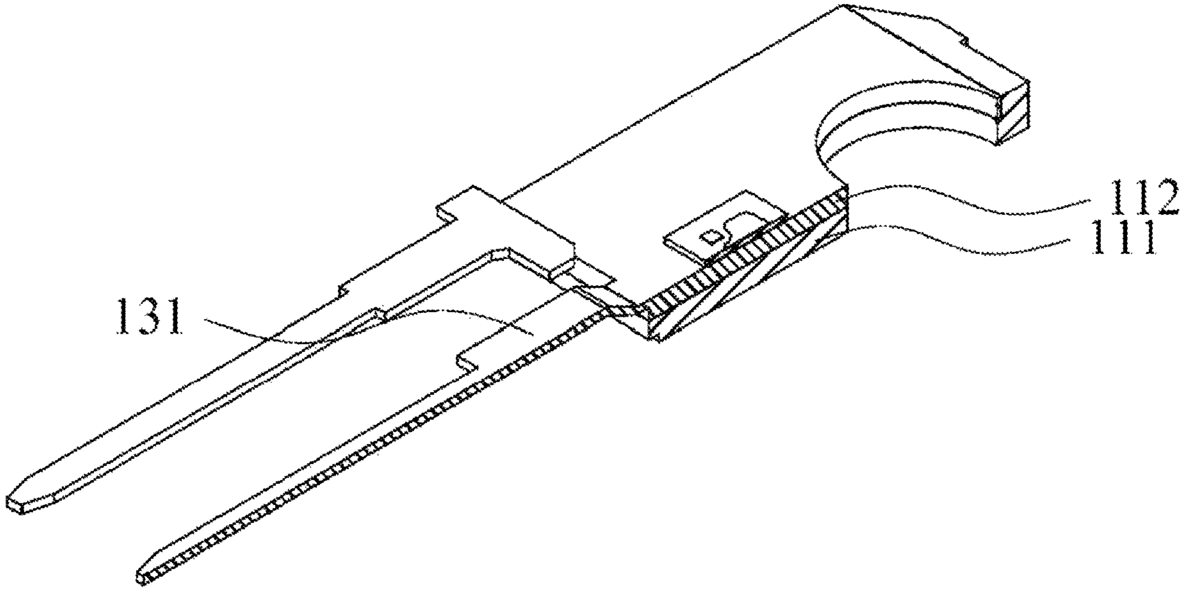
FIGS. 9A, 9B are a cross-sectional view of the semiconductor package of FIGS. 7A, 7B.
Figure 9B:
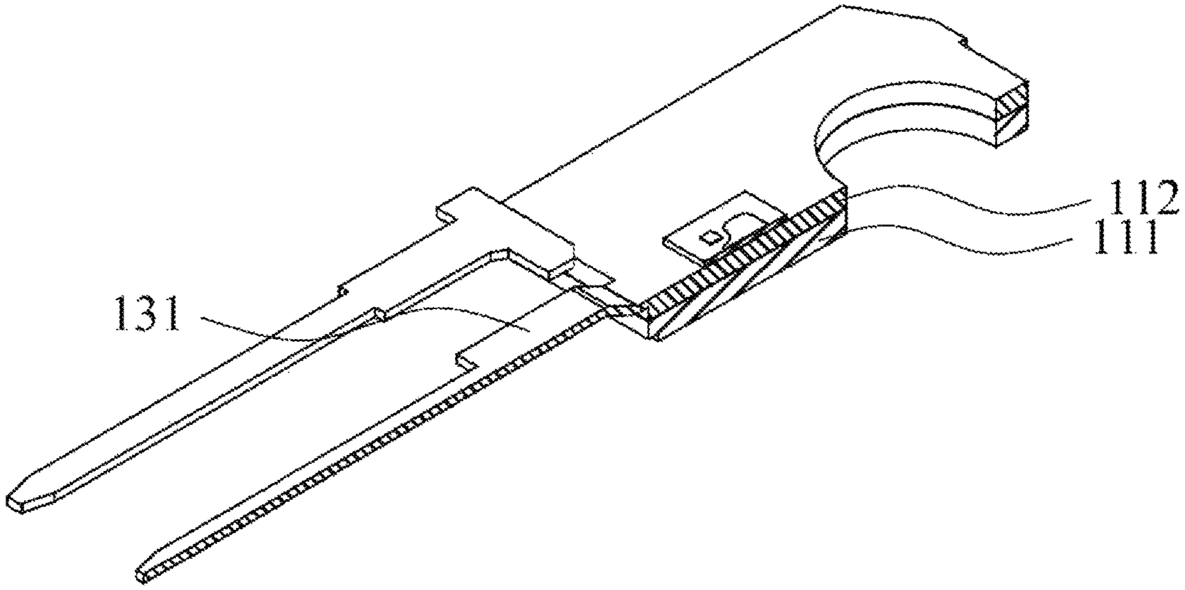

As an example of a fourth vertical structure, the second substrate 112 may be bonded to the upper surface or the lower surface of the first substrate 111. As illustrated in FIGS. 8A and 9A, the second substrate 112 is inserted into and bonded to into the upper surface of the first substrate 111 and the first terminal 131 is connected to the second substrate 112 as one body formed of the same material or as in FIGS. 8B and 9B, the second substrate 112 is bonded to cover the upper surface of the first substrate 111 and the first terminal 131 is connected to the second substrate 112 as one body formed of the same material.

That is, the second substrate 112 and the first terminal 131 may be connected to each other as one body formed of the same metal material.

Figure 10A:
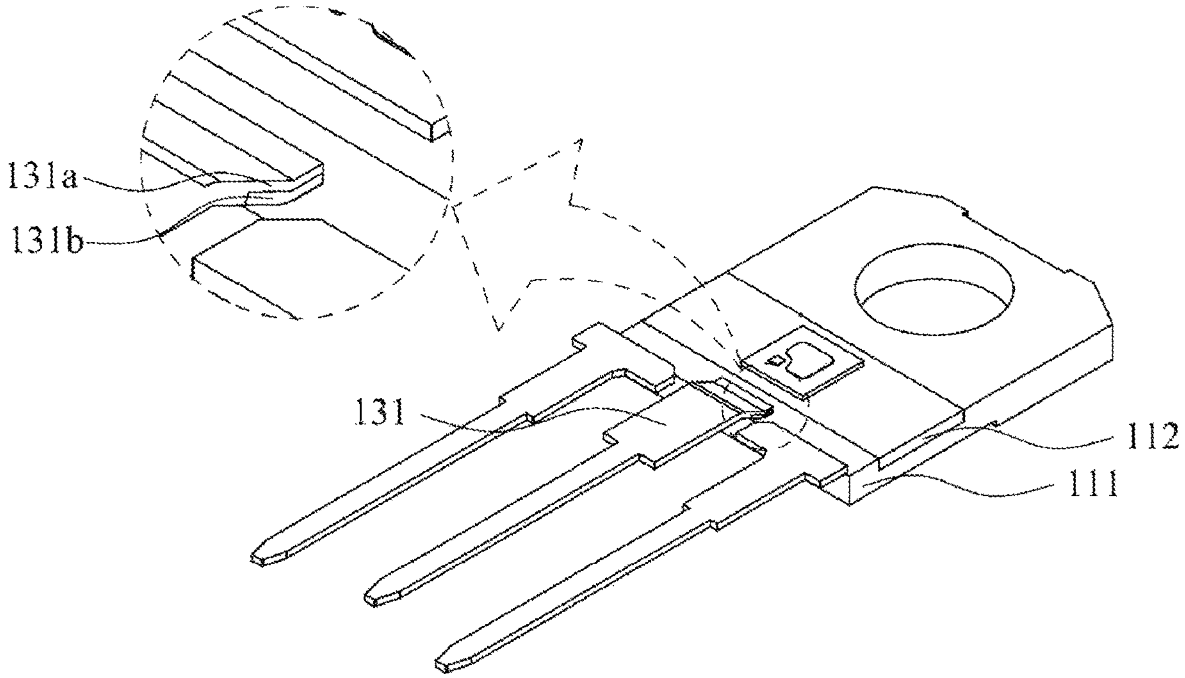
FIGS. 10A, 10B illustrate a fifth example of a semiconductor package according to an embodiment of the present invention.
Figure 10B:
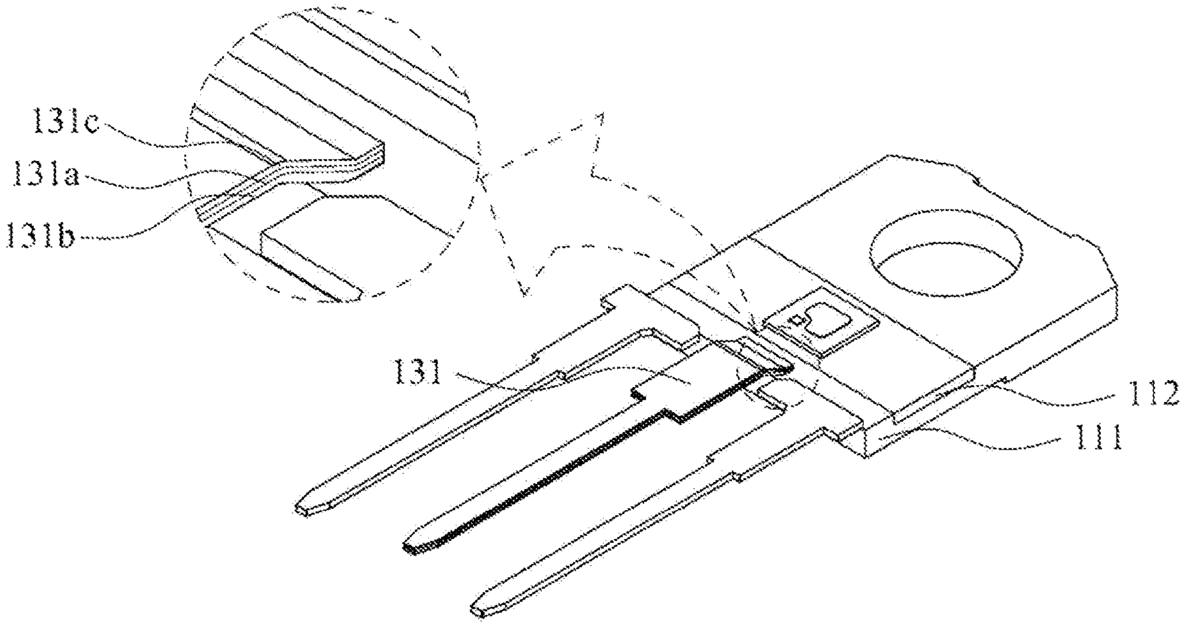

Referring to FIGS. 10A, 10B, as an example of a fifth vertical structure, the first terminal 131 may have a stacked structure formed of at least two different metals and may be structurally connected to the first substrate 111. As illustrated in FIG. 10A, the first terminal 131 may be separated into a terminal A 131*a* and a terminal B 131*b*, wherein the terminal B 131*b* may be inserted into and combined to the terminal A 131*a* and a thickness of the terminal B 131*b* is less than a thickness of the terminal A 131*a*. Accordingly, electrical conductivity may be maintained and the total weight and reduction costs may be reduced.

On the other hand, as illustrated in FIG. 10B, the first terminal 131 may be separated into the terminal A 131*a*, the terminal B 131*b*, and a terminal C 131*c*, wherein the terminal A 131*a*, the terminal B 131*b*, and the terminal C 131*c* may be combined to have a stacked structure and a thickness of the terminal B 131*b* or the terminal C 131*c* is less than a thickness of the terminal A 131*a*. Accordingly, electrical conductivity may be maintained and the total weight and reduction costs may be reduced.

Figure 12:
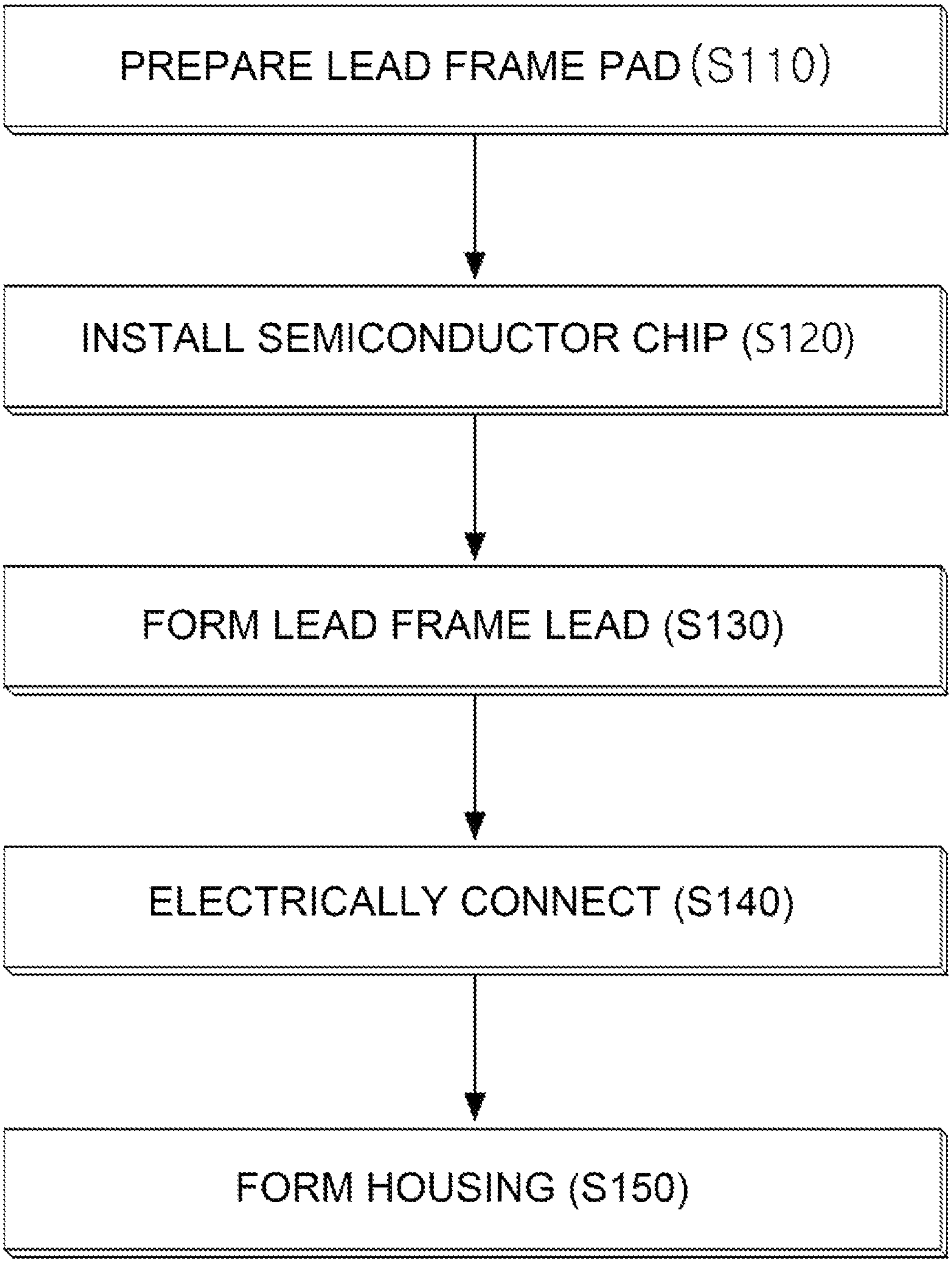
FIG. 12 is a flowchart illustrating a method of manufacturing a semiconductor package according to another embodiment of the present invention.

FIG. 12 is a flowchart illustrating a method of manufacturing a semiconductor package according to another embodiment of the present invention. The method of manufacturing a semiconductor package is as follows.

First, the lead frame pad 110 including at least one first substrate 111 and at least one second substrate 112 structurally bonded to one surface of the first substrate 111 is prepared in operation S110.

Then, at least one semiconductor chip 120 is installed onto the second substrate 112 by using a conductive adhesive in operation S120.

Then, the lead frame lead 130 is formed in such a way that at least one first terminal 131 is structurally or electrically connected to the lead frame pad 110 and at least one second terminal 132 is formed to be spaced apart from the lead frame pad 110 by a regular distance in operation S130.

Then, the semiconductor chip 120 and the second terminal 132 are electrically connected to each other by using the electrical connection member 140 in operation S140.

Then, the housing 150 is formed to partially or entirely cover the semiconductor chip 120 and the lead frame pad 110 in operation S150.

Here, the lead frame lead 130 is exposed and extended to the outside of the housing 150 and the thickness of the second substrate 112 is less than the thickness of the first substrate 111. Accordingly, the semiconductor chip 120 may be easily installed and excellent electrical conductivity may be realized.

Meanwhile, a method of manufacturing a semiconductor package according to another embodiment of the present invention is as follows.

First, the lead frame pad 110 including at least one first substrate 111, at least one second substrate 112 structurally bonded to one surface of the first substrate 111, and at least one third substrate 113 structurally bonded to the other surface of the first substrate 111 is prepared in operation S110.

Then, at least one semiconductor chip 120 is installed onto the second substrate 112 by using a conductive adhesive in operation S120.

Then, the lead frame lead 130 is formed in such a way that at least one first terminal 131 is structurally or electrically connected to the lead frame pad 110 and at least one second terminal 132 is formed to be spaced apart from the lead frame pad 110 by a regular distance in operation S130.

Then, the semiconductor chip 120 and the second terminal 132 are electrically connected to each other by using the electrical connection member 140 in operation S140.

Then, the housing 150 is formed to partially or entirely cover the semiconductor chip 120 and the lead frame pad 110 in operation S150.

Here, the lead frame lead 130 is exposed and extended to the outside of the housing 150 and the thickness of the second substrate 112 and/or the third substrate 113 is less than the thickness of the first substrate 111. Accordingly, the semiconductor chip 120 may be easily installed and excellent electrical conductivity and heat radiation performance may be realized.

As described above, the first substrate 111, which is a base substrate, the second substrate 112 on which the semiconductor chip 120 is installed, and/or the third substrate 113 may be each separately formed using a different metal. For example, the first substrate 111 may be formed of a metal which is at a relatively low price and light-weighted, and the second substrate 112 and/or the third substrate 113 may be formed of a metal which is at a relatively high price and heavy. Accordingly, excellent electrical conductivity and heat radiation performance may be maintained, the weight may be reduced, and a production cost may be lowered.

That is, the first substrate 111 may be formed of an Al material, and the second substrate 112 and/or the third substrate 113 may be formed of Cu or an Cu alloy which facilitates installation of the semiconductor chip 120 and has excellent heat radiation performance or may be formed of at least any one of Ni, Ag, Pd, and Au so as to realize excellent electrical conductivity and heat radiation performance. The thickness of the second substrate 112 and/or the third substrate 113 may be less than the thickness of the first substrate 111 so that the total weight may be reduced and a production cost may be lowered.

Preferably, the first substrate 111 may contain 50% or more of Al components compared to the total weight of the corresponding substrate and the second substrate 112 and/or the third substrate 113 may contain 50% or more of Cu components compared to the total weight of the corresponding substrate.

Also, as illustrated in the first through fifth vertical structures described above, the second substrate 112 and/or the third substrate 113 may be inserted into and bonded to the first substrate 111 or the second substrate 112 and/or the third substrate 113 may be bonded to the upper surface or the lower surface of the first substrate 111.

In addition, a horizontal area of the second substrate 112 and/or the third substrate 113 may be formed to be smaller than a horizontal area of the first substrate 111 or a horizontal area of the second substrate 112 and/or the third substrate 113 may be the same as a horizontal area of the first substrate 111.

In this regard, according to the semiconductor package and the method of manufacturing the same described above, a base substrate and a substrate on which a semiconductor chips is directly bonded are separately formed and bonded in a vertical structure so that the semiconductor chip may be easily installed, excellent electrical conductivity and heat radiation performance may be maintained, the weight may be reduced to be light-weighted, a Cu material may be minimized, and a production cost may be lowered.

According to the present invention, a base substrate (first substrate) and a substrate on which a semiconductor chips is directly bonded (second substrate) are separately formed and bonded in a vertical structure so that the semiconductor chip may be easily installed, excellent electrical conductivity and heat radiation performance may be maintained, the weight may be reduced to be light-weighted, a Cu material may be minimized, and a production cost may be lowered.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor package comprising:

a lead frame pad comprising at least one first substrate and at least one second substrate structurally bonded to one surface of the first substrate;

at least one semiconductor chip bonded onto the second substrate by using a conductive adhesive;

a lead frame lead comprising at least one first terminal structurally or electrically connected to the lead frame pad and at least one second terminal spaced apart from the lead frame pad by a regular distance;

an electrical connection member electrically connecting the semiconductor chip with the second terminal; and a housing partially or entirely covering the semiconductor chip and the lead frame pad, wherein a portion of at least one of the first and second terminals is exposed to an outside of the housing and a thickness of the second substrate is less than a thickness of the first substrate, wherein at least 80% of an exposed surface of the at least one of the first and second terminals is plated with a solder including Sn by immersing the at least one of the first and second terminals into the solder including Sn for a predetermined period of time and pulling out.

2. The semiconductor package of claim 1, wherein the second substrate is inserted into and bonded to the first substrate or bonded to the upper surface orof the lower surface of the first substrate.

3. The semiconductor package of claim 1, wherein the first substrate and the second substrate are formed of each different metal material or the same metal material.

4. The semiconductor package of claim 1, wherein a horizontal area of the second substrate is smaller than or same as a horizontal area of the first substrate.

5. The semiconductor package of claim 1, wherein the first substrate contains 50% or more of Al components compared to the total weight, or the second substrate contains 50% or more of Cu components compared to the total weight.

6. The semiconductor package of claim 1, wherein the second substrate is inserted into and bonded to the first substrate and a difference of a height-level between the surface of the first substrate and the surface of the second substrate is below 0.1 mm.

7. The semiconductor package of claim 1, wherein the first terminal is structurally connected to the first substrate or the second substrate.

8. The semiconductor package of claim 1, wherein a surface of the first terminal structurally bonded to a surface of the lead frame pad is formed of a metal material containing 50% or more of Cu or Al components compared with the total weight.

9. The semiconductor package of claim 1, wherein the first terminal has a stacked structure formed of at least two different metals.

10. The semiconductor package of claim 1, wherein the first terminal is separated into a terminal A and a terminal B and the terminal B is inserted into and bonded to the terminal A.

11. The semiconductor package of claim 1, wherein the first terminal is separated into a terminal A, a terminal B, and a terminal C which are combined to have a stacked structure.

12. The semiconductor package of claim 1, wherein the second substrate is connected to the first terminal as one body formed of the same metal material.

13. The semiconductor package of claim 1, wherein the lead frame pad and the first terminal are structurally connected to each other by ultrasonic welding or by using a conductive bonding material.

14. The semiconductor package of claim 1, wherein the lead frame pad comprises a penetration hole to connect with a heat sink.

15. A semiconductor package comprising:

a lead frame pad comprising a first substrate, a second substrate inserted into and bonded to an upper portion of the first substrate, and a third substrate inserted into and bonded to a lower portion of the first substrate;

at least one semiconductor chip bonded onto the second substrate by using a conductive adhesive;

a lead frame lead comprising at least one first terminal structurally or electrically connected to the lead frame pad and at least one second terminal spaced apart from the lead frame pad by a regular distance;

an electrical connection member electrically connecting the semiconductor chip with the second terminal; and a housing partially or entirely covering the semiconductor chip and the lead frame pad, wherein the lead frame lead is exposed and extended to the outside of the housing and the thickness of the second substrate or the third substrate is less than the thickness of the first substrate.

16. The semiconductor package of claim 15, wherein the first substrate and the second substrate or the third substrate are formed of each different metal material or the same metal material.

17. A method of manufacturing a semiconductor package comprising:

preparing a lead frame pad comprising at least one first substrate and at least one second substrate structurally bonded to one surface of the first substrate;

installing at least one semiconductor chip onto the second substrate by using a conductive adhesive;

forming a lead frame lead in such a way that at least one first terminal is structurally or electrically connected to the lead frame pad and at least one second terminal is formed to be spaced apart from the lead frame pad by a regular distance;

electrically connecting the semiconductor chip to the second terminal by using an electrical connection member; and forming a housing to partially or entirely cover the semiconductor chip and the lead frame pad, wherein a portion of at least one of the first and second terminals is exposed to an outside of the housing and a thickness of the second substrate is less than a thickness of the first substrate, wherein at least 80% of an exposed surface of the at least one of the first and second terminals is plated with a solder including Sn by immersing the at least one of the first and second terminals into the solder including Sn for a predetermined period of time and pulling out.

18. A method of manufacturing a semiconductor package comprising:

preparing a lead frame pad comprising a first substrate, a second substrate inserted into and bonded to an upper portion of the first substrate, and a third substrate inserted into and bonded to a lower portion of the first substrate;

installing at least one semiconductor chip onto the second substrate by using a conductive adhesive;

forming a lead frame lead in such a way that at least one first terminal is structurally or electrically connected to the lead frame pad and at least one second terminal is formed to be spaced apart from the lead frame pad by a regular distance;

electrically connecting the semiconductor chip to the second terminal by using an electrical connection member; and forming a housing to partially or entirely cover the semiconductor chip and the lead frame pad, wherein the lead frame lead is exposed and extended to the outside of the housing and the thickness of the second substrate or the third substrate is less than the thickness of the first substrate.

* * * * *